(12) United States Patent
Moyer

(10) Patent No.: US 8,607,121 B2
(45) Date of Patent: Dec. 10, 2013

(54) SELECTIVE ERROR DETECTION AND ERROR CORRECTION FOR A MEMORY INTERFACE

(75) Inventor: William C. Moyer, Dripping Springs, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 153 days.

(21) Appl. No.: 13/097,721

(22) Filed: Apr. 29, 2011

(65) Prior Publication Data

US 2012/0278681 A1   Nov. 1, 2012

(51) Int. Cl.
*G11C 29/00*  (2006.01)

(52) U.S. Cl.
USPC ........... 714/763; 714/758; 714/719; 714/6.1; 714/6.24; 714/54; 714/746; 714/785; 714/768

(58) Field of Classification Search
None
See application file for complete search history.

(56) References Cited

U.S. PATENT DOCUMENTS

| | | | |
|---|---|---|---|
| 3,814,922 A * | 6/1974 | Nibby et al. ................... | 714/723 |
| 4,768,197 A | 8/1988 | Petolino et al. | |
| 4,897,839 A | 1/1990 | Yamagishi et al. | |
| 5,099,484 A | 3/1992 | Smelser | |
| 5,146,461 A | 9/1992 | Duschatko et al. | |
| 5,173,905 A | 12/1992 | Parkinson et al. | |
| 5,375,127 A | 12/1994 | Leak et al. | |
| 5,430,742 A * | 7/1995 | Jeddeloh et al. .............. | 714/764 |
| 5,848,293 A | 12/1998 | Gentry | |
| 5,954,831 A | 9/1999 | Chang | |
| RE36,448 E | 12/1999 | Brady | |
| 6,253,273 B1 | 6/2001 | Blumenau | |
| 6,480,975 B1 | 11/2002 | Arimilli et al. | |
| 6,772,383 B1 | 8/2004 | Quach et al. | |
| 6,880,112 B2 | 4/2005 | Lajolo | |
| 6,954,826 B2 | 10/2005 | Moyer | |
| 7,069,494 B2 | 6/2006 | Cargnoni et al. | |
| 7,257,762 B2 * | 8/2007 | Holm et al. .................... | 714/763 |
| 7,272,773 B2 | 9/2007 | Cargnoni et al. | |
| 7,334,179 B2 | 2/2008 | Zhang et al. | |
| 7,376,877 B2 | 5/2008 | Quach et al. | |
| 7,398,449 B1 * | 7/2008 | Normoyle et al. ............ | 714/767 |
| 7,409,502 B2 | 8/2008 | Moyer et al. | |
| 7,480,847 B2 | 1/2009 | Schulz | |
| 7,506,226 B2 | 3/2009 | Gajapathy et al. | |
| 7,526,713 B2 * | 4/2009 | Klein .............................. | 714/763 |
| 7,568,146 B2 | 7/2009 | Takahashi et al. | |
| 7,617,437 B2 * | 11/2009 | Moyer .......................... | 714/763 |
| 7,900,100 B2 * | 3/2011 | Gollub .......................... | 714/718 |

(Continued)

OTHER PUBLICATIONS

U.S. Appl. No. 13/053,962, filed Mar. 22, 2011, entitled "Selective Checkbit Modification for Error Correction."

(Continued)

*Primary Examiner* — John Trimmings

(57) ABSTRACT

Error correction code (ECC) checkbits are generated for each write access to a memory address based on both the data to be written (the write data) and the memory address. The ECC checkbits are stored with the write data at the memory device associated with the memory address. In addition, the memory device can selectively perform error detection and correction for write accesses using the ECC checkbits. For example, the memory device can include an ECC control register that stores control information to selectively enable and disable error detection and correction for write accesses. In an embodiment, error detection and correction can be selectively enabled and disabled for different sizes of write data.

19 Claims, 4 Drawing Sheets

(56) References Cited

U.S. PATENT DOCUMENTS

| | | | |
|---|---|---|---|
| 2003/0188251 A1* | 10/2003 | Brown et al. | 714/763 |
| 2005/0240745 A1 | 10/2005 | Iyer et al. | |
| 2005/0257025 A1 | 11/2005 | Spencer | |
| 2006/0010339 A1* | 1/2006 | Klein | 714/5 |
| 2006/0031739 A1 | 2/2006 | Gan et al. | |
| 2006/0117239 A1* | 6/2006 | Lin et al. | 714/758 |
| 2006/0236205 A1 | 10/2006 | Kuramoto et al. | |
| 2007/0136647 A1 | 6/2007 | Kanai et al. | |
| 2007/0150671 A1 | 6/2007 | Kurland | |
| 2007/0220354 A1* | 9/2007 | Moyer | 714/42 |
| 2007/0266297 A1 | 11/2007 | Liang et al. | |
| 2007/0277085 A1 | 11/2007 | Goessel et al. | |
| 2008/0016428 A1* | 1/2008 | Lee et al. | 714/763 |
| 2008/0055125 A1 | 3/2008 | Cideciyan et al. | |
| 2008/0109705 A1* | 5/2008 | Pawlowski et al. | 714/767 |
| 2008/0162829 A1 | 7/2008 | Scott et al. | |
| 2008/0235558 A1 | 9/2008 | Normoyle et al. | |
| 2008/0294840 A1 | 11/2008 | Bliss et al. | |
| 2009/0049350 A1* | 2/2009 | Parris et al. | 714/720 |
| 2009/0100315 A1 | 4/2009 | Lee | |
| 2009/0249148 A1* | 10/2009 | Ito et al. | 714/746 |
| 2009/0307537 A1* | 12/2009 | Chen et al. | 714/54 |
| 2010/0106872 A1 | 4/2010 | Moyer et al. | |
| 2010/0107243 A1 | 4/2010 | Moyer et al. | |
| 2011/0040924 A1* | 2/2011 | Selinger | 711/103 |
| 2011/0138252 A1* | 6/2011 | Pawlowski et al. | 714/763 |
| 2012/0066567 A1 | 3/2012 | Moyer et al. | |
| 2012/0166904 A1 | 6/2012 | Bandholz | |

OTHER PUBLICATIONS

U.S. Appl. No. 12/886,641, filed Sep. 21, 2010, entitled "Data Processor for Processing Decorated Instructions with Cache Bypass."
U.S. Appl. No. 13/159,878, filed Jun. 14, 2011, entitled "Selective Masking for Error Correction."
Non-Final Office Action mailed Apr. 5, 2013 for U.S. Appl. No. 13/159,878, 36 pages.
Notice of Allowance mailed Jun. 18, 2013 in U.S. Appl. No. 13/053,962, 26 pages.
Final Office Action mailed Aug. 26, 2013 in U.S. Appl. No. 13/159,878, 26 pages.

\* cited by examiner

SELECTIVE ERROR DETECTION AND ERROR CORRECTION FOR A MEMORY INTERFACE

FIELD OF THE DISCLOSURE

The present disclosure relates generally to data processing devices, and more particularly to error detection and correction for data processing devices.

BACKGROUND

Data processing operations frequently involve transfers of data between endpoints, whereby a data source provides the data for transfer and a data sink subsequently receives the data. A memory device is typically employed to temporarily store the transferring data between the data source and data sink. However, the transfer and storage of the data at the memory device can introduce errors in the data. For example, a faulty memory module can cause bits of the data to be represented at the memory device in an incorrect state. Accordingly, some data processing systems employ error correction techniques whereby error correction code (ECC) checkbits are calculated for each segment of data stored at the memory device. In response to a request to transfer data from the memory to a data sink, the ECC checkbits stored in the memory are used to detect and correct errors in the stored data. However, in certain data processing systems, the memory device does not detect errors in the data that result from the transfer of data to the processor unit. Accordingly some data processing devices employ end-to-end (e2e) error detection and correction, whereby ECC checkbits are generated at the data source and error detection is performed at the data sink. This allows for detection and correction of errors resulting both from temporary storage of data as well as errors resulting from data transfer.

BRIEF DESCRIPTION OF THE DRAWINGS

The present disclosure may be better understood, and its numerous features and advantages made apparent to those skilled in the art by referencing the accompanying drawings.

DETAILED DESCRIPTION

FIGS. 1-4 illustrate example techniques for performing error detection and correction at a data processing device. Error correction code (ECC) checkbits are generated for each write access to a memory address based on both the data to be written (the write data) and the memory address. The ECC checkbits are stored with the write data at the memory device associated with the memory address. In response to a read access from a requesting module, the memory device provides the ECC checkbits and data (the read data) at the memory address indicated by the read access. The requesting module employs the ECC checkbits to detect and correct errors in the read data. In addition, the memory device can selectively perform error detection and correction for write accesses using the ECC checkbits. For example, the memory device can include an ECC control register that stores control information to selectively enable and disable error detection and correction for write accesses. In an embodiment, error detection and correction can be selectively enabled and disabled for different sizes of write data.

Selective error detection and correction (sometimes collectively abbreviated as error detection/correction) provides for flexibility in implementation of an error checking scheme. In particular, enabling error detection for all write accesses increases the robustness of data storage at the cost of a performance penalty. Accordingly, by selectively enabling error detection the desired tradeoff between robustness and performance can be achieved for a particular device or application. In addition, error detection/correction at the memory device can cause difficulty in logic and functional testing of error detection modules at other device modules because it is more difficult to inject deliberate errors for testing. Accordingly, selective enabling of error detection/correction can allow for error injection operations to take place without error detection or correction at the memory device.

Figure 1:
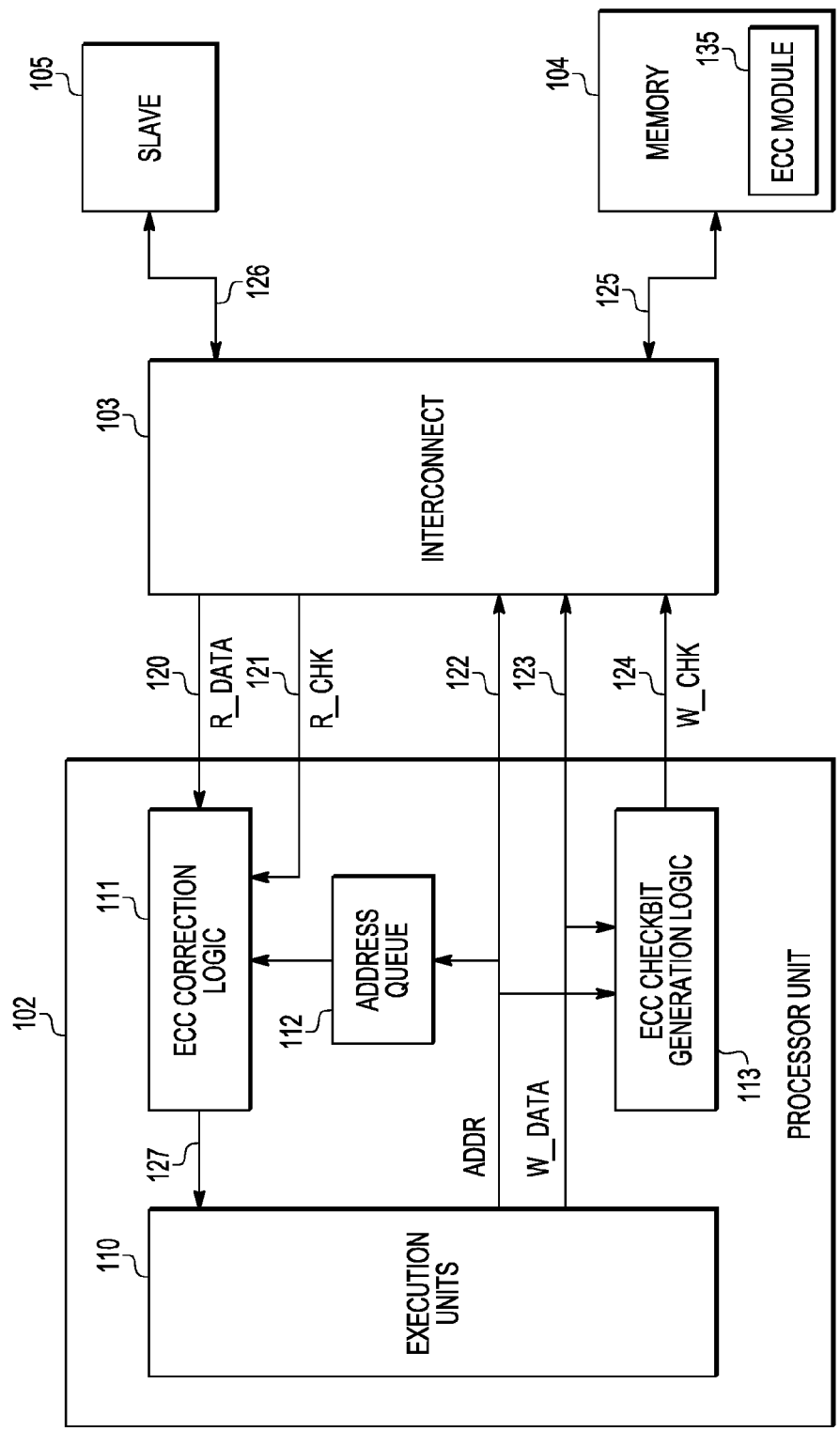
FIG. 1 is a block diagram illustrating a data processing device in accordance with a specific embodiment of the present disclosure.
Figure 2:
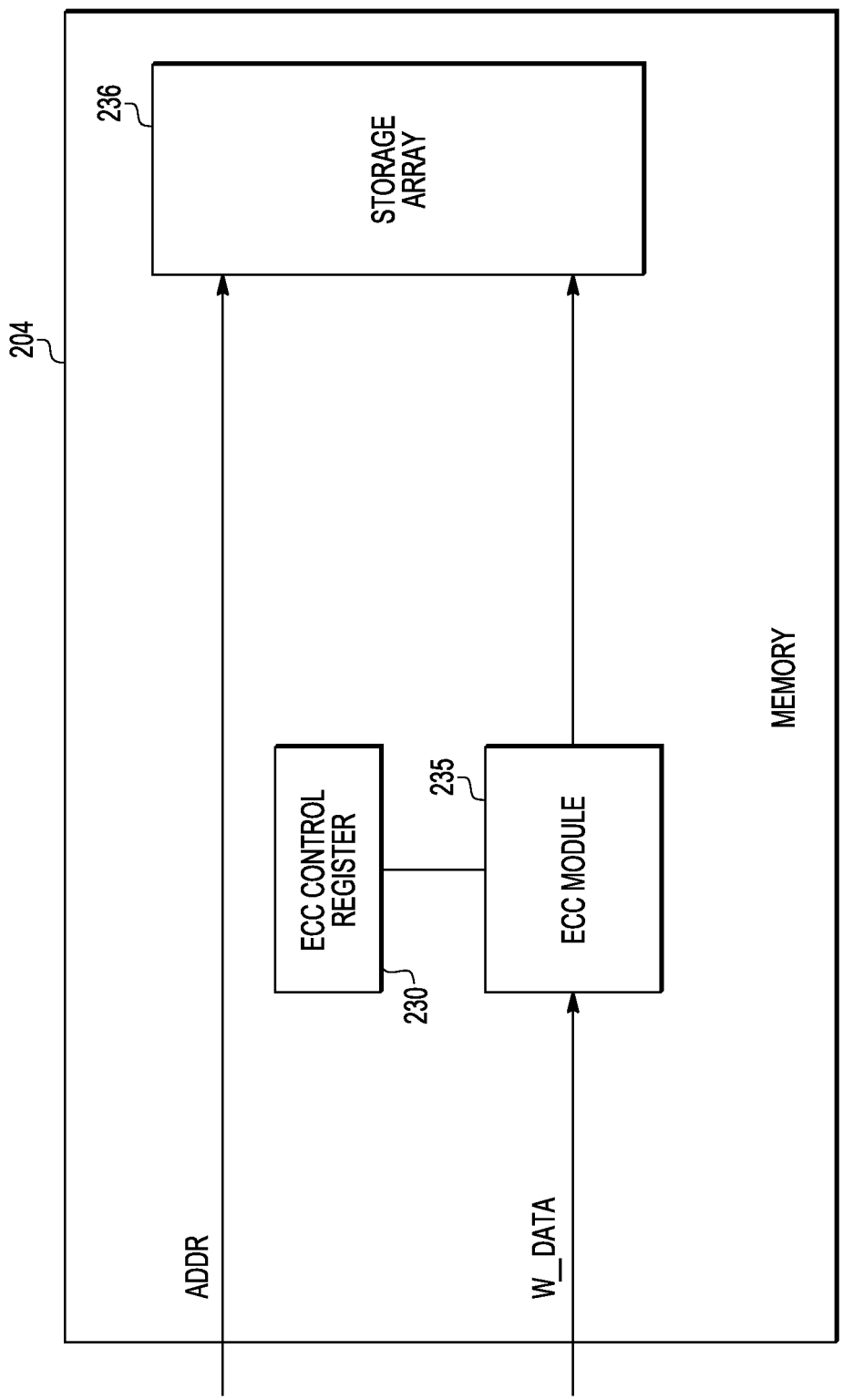
FIG. 2 is a block diagram of the memory device of FIG. 1 in accordance with one embodiment of the present disclosure.

FIG. 1 illustrates a data processing device 100 in accordance with one embodiment of the present disclosure. In the embodiment illustrated at FIG. 1, the data processing device 100 is a general purpose data processing device that can be incorporated into an electronic device, such as a portable electronic device, computer devices, automotive device, and the like. The data processing device 100 is generally configured to decode a set of instructions into one or more operations, and execute the operations in order to perform tasks associated with the electronic system. For example, the data processing device 100 can be incorporated in a mobile telephone device, and execute sets of instructions to send and receive phone calls, access the Internet, send and receive text messages, and the like.

As described further herein, the data processing device 100 employs an end-to-end error detection and correction scheme. To illustrate, a data source at the data processing device 100 generates data to be stored at a memory address. Based on both the data and the address, the data source generates a set of ECC checkbits, and provides both the data and the ECC checkbits to a memory device for storage at the memory address. The combined data and checkbits are stored as a codeword. A typical codeword might consist of 64 data bits and 8 checkbits, where the checkbits are calculated according to a particular coding scheme using the 64 data bits as well as the memory address value (or a portion thereof) of the location the data is stored. A data sink can access the stored data by providing the memory address to the memory device, which in response provides both the stored data and the associated ECC checkbits. The data sink performs error detection and correction using the ECC checkbits based on the predetermined coding scheme. The data sink can therefore detect errors both in the stored data and in the memory address provided to the memory device.

To improve storage robustness, a memory device can include an ECC module to perform error detection and correction using the ECC checkbits for each write access. The memory device can include a software accessible control register that allows for selection of different access control policies, whereby the access control policies selectively enable or disable error detection and correction at the memory device. In an embodiment, the following policies can be selected: 1) error detection and correction is not performed for any write access; 2) error detection is enabled for all write accesses, but error correction is not enabled for any write access; 3) error detection and correction is performed for all write accesses; and 4) error detection and correction is performed for partial-width write accesses, and is not performed for full-width write accesses.

As used herein, the width of a memory codeword refers to the width of data stored in the memory device that is protected by the ECC checkbits within the codeword. Accordingly, a full-width write access refers to a write access that writes data to the full width of the codeword. A partial width-write refers to a write to less than the full width of the stored memory codeword. In an embodiment, partial-width writes have width that is an integer fraction (e.g. one-half) of the full width of the memory codeword. Double-width writes may also be supported, where a double width write is defined to be an aligned pair of full-width writes, and in an embodiment, is treated as a full-width write under the access control policy.

Selectively enabling and disabling error detection and error correction at the memory device can be useful, for example, to perform testing on error detection and correction at a requesting module that generates a read access for the data. In particular, a test procedure can deliberately introduce errors to data provided for storage at the memory device and determine whether the deliberately introduced errors are detected and corrected at the requesting module. Conventional systems that employ error detection and correction at the memory device are either unable to test error detection and correction at the requesting device by deliberately introducing errors (because those errors are detected and corrected at the memory device), or are required to introduce errors after the data has been retrieved from the memory device (which may not provide as robust a test of the system as introducing the errors prior to storage at the memory device).

Referring again to FIG. 1, the data processing device 100 includes a processor unit 102, an interconnect 103, a memory device 104, and a slave device 105. The processor unit 102 is connected to the interconnect 103 via a set of busses, labeled bus 120 through bus 124, while the memory 104 is connected to the interconnect 103 via a bus 125. The slave device 105 is connected to the interconnect 103 via a bus 126.

The processor unit 102 is a module configured to decode processor instructions into one or more operations and execute the operations in order to perform the functions of the data processing device 100. For example, in one embodiment the data processing device 100 is part of an automobile control system, and the processor unit 102 executes operations to control aspects of the automobile's functions, such as detection of automobile conditions, management and control of different automotive features, and the like.

An example operation that can be executed by the processor unit 102 is referred to as a memory access, whereby the processor unit 102 provides data to be transferred to a memory device (a write operation) or requests data to be transferred from the memory device to the unit (a read operation). In addition, the processor unit performs error detection and correction functions for the data transfer operations.

To illustrate, for a write operation, the processor unit 102 provides, via bus 123, the data to be transferred (the write data) and provides, via bus 122, an address of the memory location to which the write data is to be transferred. In addition, the processor unit 102 generates a set of ECC checkbits based on both the address and the write data and provides the set of ECC checkbits via the bus 124. As described further herein, the ECC checkbits can be used by a data sink to detect and correct errors in both the write data and the address.

For a read operation, the processor unit 102 provides, via bus 122 the address of the location of the data to be transferred (the read data). In response, the processor unit 102 receives, via bus 120, the read data and receives, via bus 121, the set of ECC checkbits associated with the read data and the address. The processor unit 102 performs error correction and detection on the read data and address using the received ECC checkbits.

The interconnect 103 is a communication link configured to transfer information between the processor unit memory 102, the memory device 104, the slave device 105, and other devices (not shown). Accordingly, the interconnect 103 can manage communication overhead features, such as communication routing, buffering, flow control, bus management, communication acknowledgement, and the like. The interconnect 103 can also manage other device functions, such as interrupt signaling, memory coherency, and the like.

The memory device 104 includes memory locations configured to store information, and retrieve stored information, based on address information, data information, and control signaling, all received via the bus 125. In particular, in response to a write operation, as indicated by an address, write data, ECC checkbits, and associated control signaling received via bus 125, the memory 104 stores the write data and ECC checkbits at a memory location corresponding to the address. In response to a read operation, as indicated by an address and associated control signaling received via bus 125, the memory 104 retrieves the read data and ECC checkbits stored at the indicated memory location and provides the retrieved information via the bus 125.

In addition, the memory device 104 includes an ECC module 135 configured to implement an access control policy as indicated by programmable policy control information. The policy control information can be stored at a register local to the memory device 104, can be provided by control signaling from the module that generated the write access, and the like. Depending on the indicated access control policy, the ECC module can perform error detection, error correction, or both, for received write accesses. In particular, in response to determining error detection is enabled for a particular write access, the ECC module 135 employs the ECC checkbits associated with the write access to detect errors in the write data. If no errors are detected, the memory device 104 stores the data and ECC checkbits normally. If an error is detected, the ECC module 135 determines if error correction is enabled for the write access. If not, the ECC module 135 signals an error to the processor unit 102. If error correction is enabled by the access control policy, the ECC module 135 corrects the detected error and stores the corrected data and ECC checkbits at the memory device 104.

The slave 105 is a device, such as an input/output device, configured to receive and provide information via the bus 126. The received information can be employed to send the slave 105 commands, configure operation of the slave 105, and the like. The provided information can include command responses, device status information, and the like.

The processor unit 102 includes execution units 110, ECC correction logic 111, address queue 112, ECC and checkbit generation logic 113. The execution units 110 are connected to busses 122 and 123 and to ECC correction logic 111 via a bus 127. The address queue 112 is connected to the bus 122 and to the ECC correction logic 111. The ECC correction logic 111 is also connected to the busses 120 and 121. The ECC checkbit generation logic 113 is connected to the busses 122-124.

The execution units 110 are a part of an instruction pipeline (not shown) of the processing unit 102, and execute operations, including data transfer operations, dispatched by the pipeline. Accordingly, for write operations, the execution units 110 determine both the memory address and the data associated with the operation and provide the memory address via bus 122 and the write data via the bus 123. For read operations the execution units 110 determine the memory address to be read, provide the determined memory address via the bus 122, and receive the data associated with the memory address via the bus 127. The execution units 110 can perform further operations on the received data, provide the data to other modules of the processor unit 102, and the like.

The address queue 112 is a first-in first out (FIFO) storage module that retrieves, from the bus 122, and stores memory addresses associated with read operations. In an embodiment, the address queue determines that a memory address provided via the bus 122 is associated with a read access based on control signaling (not shown) provided by the execution units 110. Address queue 112 maintains a set of one or more memory access addresses associated with outstanding (i.e. in-progress) read transactions issued by processor unit 102 to the interconnect 103 for processing by memory unit 104, slave unit 105, or other units within data processing system 100 (not shown).

The ECC checkbit generation logic 113 generates ECC checkbits for write accesses. In particular, during a write access, the ECC checkbit generation logic is provided the memory address where the write data is to be written (the write address) via the bus 122 and is provided the write data via the bus 123. Based on both the write address and the write data, the ECC checkbit generation logic 113 generates checkbits according to a conventional ECC checkbit generation technique, such as using a Hamming-based error correction matrix, or using a similar Hsaio coding scheme. Other error correction coding schemes such as Reed-Solomon or Bose-Chaudhuri-BCH codings may also be employed.

The ECC correction logic 111 performs error detection and correction for read operations. In particular, the ECC correction logic 111 receives read data via the bus 120 and a corresponding set of ECC checkbits via the bus 121. The ECC error detection and correction performed by the ECC correction logic 111 can be in accordance with one or more conventional ECC detection and correction techniques, such as Hamming code error detection, Reed-Solomon error detection and the like. After the ECC error detection and correction, the ECC correction logic 111 provides the resulting data to the execution units 110 via the bus 127. The ECC correction logic 111 can also provide additional control information via the bus 127, such as an indication whether or not an error was detected in the read data, whether or not a detected error was corrected, and the like.

In the illustrated embodiment of FIG. 1, additional error detection and correction can take place at the memory device 104. This can be better understood with reference to FIG. 2, which illustrates a memory device 204 in accordance with one embodiment of the present disclosure.

Memory device 204 includes an ECC module 235 and a storage array 236. The storage array is connected to an address bus and the ECC module 235 is connected to the address bus and (need to add connection to figure) a data bus, whereby each of the busses is connected to the interconnect 103 of FIG. 1. The ECC module 235 also includes an output connected to the storage array 236. In addition, the memory 104 includes an ECC control register 230 connected to the ECC module 235.

The ECC control register 230 is a programmable register that stores access control policy information. In an embodiment, the ECC control register 230 can be programmed by software executing at the processor unit 102 or other processor unit. By programming the ECC control register 230 with selected predefined values, the software can set or change the access control policy to predefined policies that correspond to the selected predefined values.

In an embodiment, the ECC control register 230 includes a two bit field that sets the access control policy for write accesses to the memory 104. For example, the two bit field can indicate the access control policy as set forth in the following table:

| BIT VALUES | ACCESS CONTROL POLICY |
|---|---|
| 00 | Do not perform error detection on any write accesses |
| 01 | Perform error detection, but not error correction for write accesses; Indicate errors to processor unit 102 |
| 10 | Perform error detection and error correction for all write accesses |
| 11 | Perform error detection and error correction for partial-width write accesses (including misaligned full-width write accesses); do not perform error detection for aligned full-width write accesses (including aligned double-width accesses) |

In an embodiment, the ECC control register 230 can store additional control information, such as address information to indicate the register address and information to control error detection and correction at the processor unit 102. For example, the ECC control register 230 can store control information to enable or disable error detection, or error correction, at the processor unit 102 fat the processor unit 102 for read accesses. In addition, the ECC control register 230 can store control information to enable or disable error detection, or error correction, at other memory devices, or other slave units, of the processor unit 102.

The ECC module 235 is configured to implement the access control policy indicated by the control information stored at the ECC control register 230. Accordingly, for each received write access, the ECC module 235 determines whether error detection and error correction is enabled for the write access. This can be better understood with reference to FIGS. 3 and 4.

Figure 3:
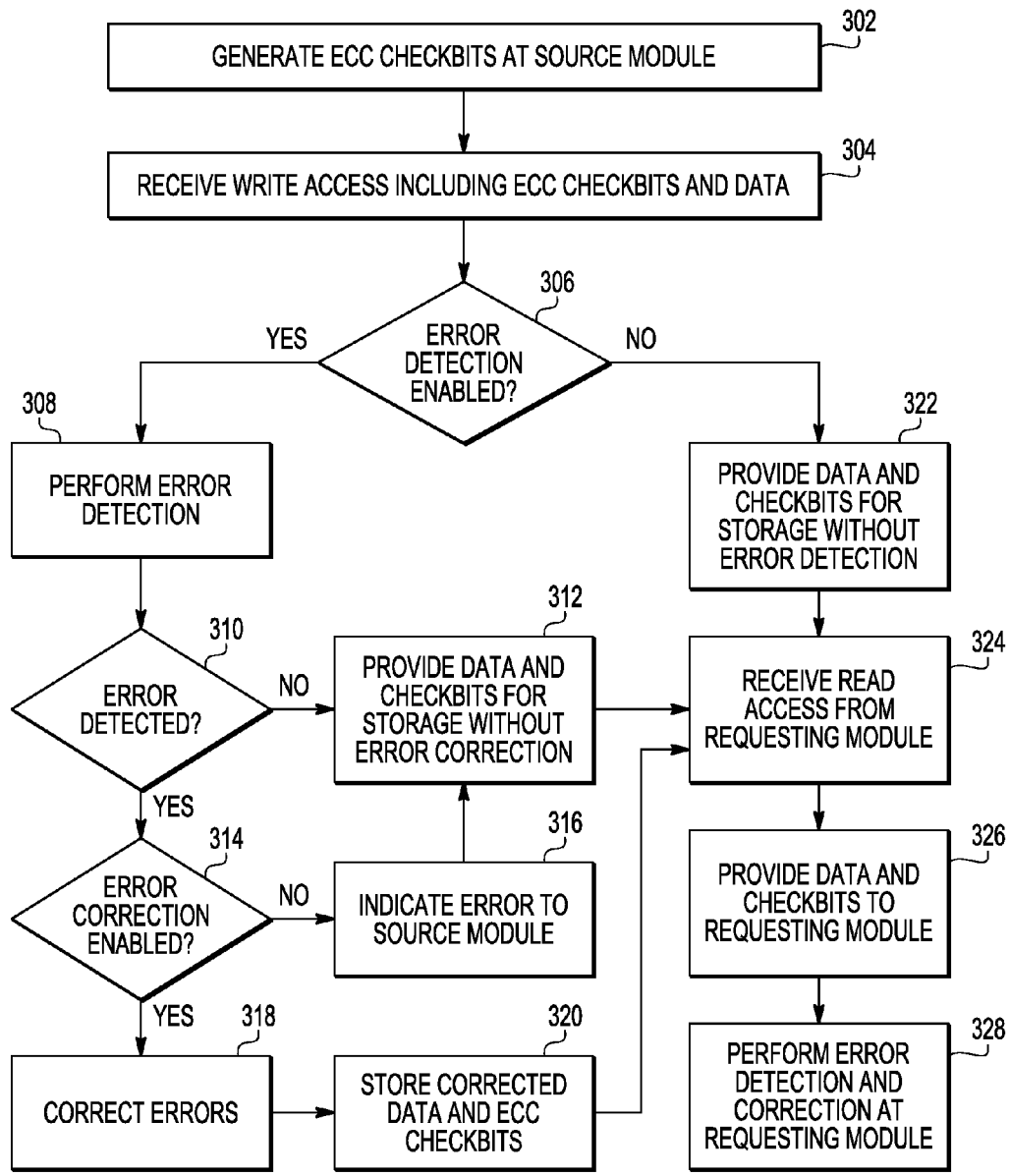
FIG. 3 is a flow diagram of a method of selectively performing error detection and error correction at the data processing device of FIG. 1 in accordance with one embodiment of the present disclosure.

FIG. 3. illustrates a flow diagram of a method of selectively performing error detection and error correction at the data processing device 100 in accordance with one embodiment of the present disclosure. At block 302 a source module (e.g. the processor unit 102) generates a write access, and also generates a set of ECC checkbits based on the write data and address associated with the write request. At block 304, the memory device 204 receives the write access including the ECC checkbits and write data. At block 306 the ECC module 235 determines, based on the contents of the ECC control register 230 or other access control policy information, whether error detection is enabled for the write access. If so, the method flow moves to block 308 and the ECC module 235 performs error detection on the write data using the ECC checkbits. At block 310 the ECC module 235 determines whether an error has been detected in the write data. If no error is detected, the method flow proceeds to block 312 and the ECC module 235 provides the write data and ECC checkbits to the storage array 236 without performing error correction. The method flow moves to block 324 and the memory device 204 receives a read access for the stored data from a requesting module (e.g. processor unit 102). At block 326 the memory 326 provides the data and ECC checkbits to the requesting module in response to the read access. At block 328 error detection, and error correction if necessary, are performed at the requesting module, thereby providing end-to-end error detection and error correction.

Returning to block 310, in response to detecting an in the write data, the method flow moves to block 314 and the ECC module 235 determines whether the access policy control information indicates that error correction is enabled for the write access. If not, the method flow moves to block 316 and the memory device 204 indicates an error to the source module. The method moves to block 312 and the data and checkbits are stored at the storage array 236 without error correction.

Returning to block 314, if the ECC module 235 determines that error correction is enabled for the write access, the method flow proceeds to block 318 and the errors are corrected. In response to correcting the data, the method flow proceeds to block 320 and the corrected data and ECC checkbits are stored at the storage array 236. The method flow proceeds to block 324. In an embodiment, the ECC module 235 can only correct errors that are at or below a predetermined threshold size (e.g. single-bit errors). Accordingly, for errors that cannot be corrected, the memory device 204 can indicate an error to the source module, as at block 316.

Returning to block 306, if the ECC module 235 determines that error detection is not enabled for the write access, the method flow proceeds to block 322 and the ECC module provides the write data and ECC checkbits to the storage array 236 for storage. The method flow proceeds to block 324, described above.

Figure 4:
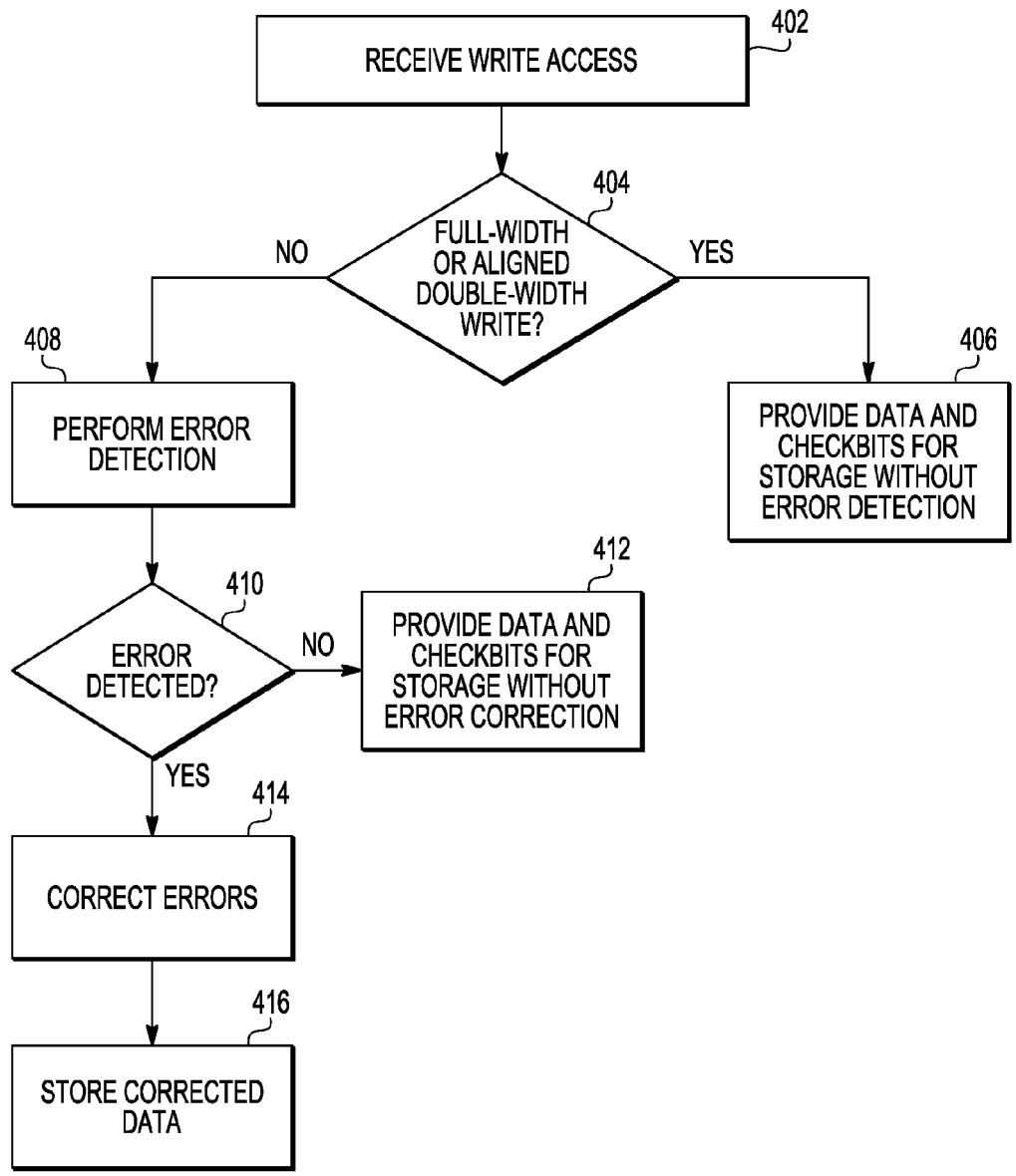
FIG. 4 is a flow diagram of a method of selectively performing error detection and error correction at the memory device of FIG. 2 based on a write access size in accordance with one embodiment of the present disclosure.

FIG. 4 illustrates a flow diagram of a particular embodiment of a method of selectively performing error detection and error correction at the memory device 204 based on a size of a write access request. At block 402 the memory device 204 receives a write access from a source module, the write access including write data and associated ECC checkbits. At block 404 memory device 204 determines, based on the size of the write data and the write address, if the write access is an aligned full-width write or aligned double-width write. If so, the method flow proceeds to block 406 and the memory device 204 provides the write data and the ECC checkbits to the storage array 236 for storage without performing error detection.

If it is determined, at block 404, that the write access is not an aligned full-width or aligned double-width write, the method flow proceeds to block 408 and the ECC module 235 performs error detection on the write data using the ECC checkbits. At block 410 the ECC module 235 determines whether an error has been detected. If not, the method flow proceeds to block 412 and the method flow proceeds to block 406 and the memory device 204 provides the write data and the ECC checkbits to the storage array 236 for storage without performing error correction, as there are no errors to be corrected.

If an error is detected, the method flow proceeds to block 414 and the ECC module 235 corrects the detected errors. The method flow moves to block 416 and the ECC module 235 provides the corrected data and ECC checkbits to the storage array 235 for storage.

By performing selective error detection and correction for certain types of write cycles, but not other types of write cycles, robustness of detection of data or address error cases can be increased, while still allowing for error injection by a data source to be performed at the time a write is initiated. Error injection writes are performed with a subset of write access sizes, and all other non-error injection writes are performed with a different subset of write access sizes. A subsequent read access can be used to determine whether error checking and checkbit generation logic within data processing system 100 is performing properly. Since the memory device has control policies which allow a user to determine whether write data errors are detected and optionally corrected for these size subsets, the data processing system can support error injection cases when necessary (and not performing error checking for these cases), while checking and correcting data errors for all other types of writes, and thus can maintain data error robustness. In addition, the user of data processing system 100 can also make a performance/robustness tradeoff with respect to performing error checking and correction for write accesses by selecting the optimal write error checking policy for the current task or process being performed, and may dynamically change this policy as the needs of the application change. This dynamic control allows for increased efficiency of data processing system 100.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

As used herein, the term "first" can refer to any selected item, and does not necessarily refer to first in time or first in a particular order. Thus, for example, the term "first checkbit" can refer to any one of a set of checkbits, and does not refer to the placement of a checkbit in time or order.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. In a data processing device comprising a processor unit coupled to a memory, a method comprising:
   receiving a write access comprising data to be written to the memory; and
   executing a first error detection procedure in response to receiving the write access, the first error detection procedure comprising:
   in response to determining the data is of a first size, performing error detection on the data; and
   in response to determining the data is of a second size, writing the data to memory without performing error detection on the data.

2. The method of claim 1, wherein executing the first error detection procedure comprises performing the first error detection procedure in response to determining access control policy information indicates a first access policy, and further comprising:
in response to determining the access control policy information indicates a second access policy, writing the data to memory without performing error detection when the data is of the first size and when the data is of the second size.

3. The method of claim 1, wherein executing the first error detection procedure comprises executing the first error detection procedure in response to determining access control policy information indicates a first access policy, and further comprising:
in response to determining the access control policy information indicates a second access policy, performing error detection prior to writing the data to memory when the data is of the first size and when the data is of the second size.

4. The method of claim 3, further comprising:
in response to determining the access control policy information indicates the second access policy, performing error correction on the data in response to detecting an error; and
in response to determining the access control policy information indicates a third access policy:
performing error detection when the data is of the first size and when the data is of the second size; and
indicating an error to the processor unit in response to detecting an error without performing error correction on the data.

5. The method of claim 1, wherein performing error detection comprises performing error detection based on a set of ECC checkbits, the ECC checkbits based on a memory address associated with the memory request.

6. The method of claim 1, wherein executing the first error correction procedure comprises executing the first error correction procedure at the memory, and further comprising:
performing a second error correction procedure at a module that generates the write access, the second error correction procedure generating a set of error correction code (ECC) checkbits for use by the first error correction procedure.

7. The method of claim 6, further comprising:
receiving at the memory a read access for the data, the read access generated by a requesting module;
providing the data and ECC checkbits to the requesting module in response to the read access; and
performing error detection on the data at the requesting module based on the ECC checkbits.

8. The method of claim 1, wherein the first size corresponds to a width of the memory.

9. A method, comprising:
receiving a write access comprising data to be written to the memory;
determining an access control policy in response to the write access; and
selectively performing a first error detection procedure on the data to be written to the memory based on the access control policy.

10. The method of claim 9, further comprising:
providing the data from the memory to a requesting module via the interconnect in response to a read access; and
performing a second error detection procedure on the data at the requesting module in response to the memory providing the data 11. The method of claim 9, wherein selectively performing the first error detection procedure comprises:
in response to determining the access control policy is a first policy, storing the data without performing error detection; and
in response to determining the access control policy is a second policy, performing error detection on the data.

12. The method of claim 9, wherein selectively performing the first error detection procedure further comprises:
in response to determining the access control policy is the second policy, indicating an error to the source module in response to detecting an error.

13. The method of claim 12, wherein selectively performing the first error detection procedure further comprises:
in response to determining the access control policy is the second policy, performing error correction on the data in response to detecting an error in the data; and
in response to determining the access control policy is a third policy:
performing error detection on the data prior to storing the data; and
storing the data without performing error correction in response to detecting an error in the data.

14. The method of claim 13, wherein determining the access policy comprises determining the access policy based on a value stored at a register.

15. The method of claim 9, wherein selectively performing the first error detection procedure further comprises:
selectively performing the first error detection procedure based on a size of the data.

16. The method of claim 15, wherein selectively performing the first error detection procedure based on the size of the data comprises:
storing the data without performing error detection in response to determining the size of the data corresponds to a width of the memory; and
performing error detection prior to storing the data in response to determining the size of the data does not correspond to the width of the memory.

17. A data processing device, comprising:
a source module to generate, for a write access, a set of ECC checkbits based on data to be written;
a memory;
an interconnect to provide the write access to the memory;
a storage location to store access control policy information; and
the memory comprising an ECC module to selectively perform a first error detection procedure on the data based on the access control policy, the ECC module further to:
in response to determining the access control policy is a first policy:
perform error detection on the data prior to the memory storing the data; and
perform error correction on the data in response to detecting an error in the data; and
in response to determining the access control policy is a second policy:
perform error detection on the data prior to storing the data at the memory; and
store the data at the memory without performing error correction in response to detecting an error in the data.

18. The data processing device of claim 17, further comprising:
a requesting module to generate a read request for the data, the memory to provide the data to the requesting module in response to the read request, the requesting module to perform a second error detection procedure on the data in response to the memory providing the data.

19. The data processing device of claim 17, wherein the ECC module is to:
in response to determining the access control policy is a third policy, store the data at the memory without performing error detection.

* * * * *